United States Patent [19]

Maitre

[11] Patent Number: 4,855,614

[45] Date of Patent: Aug. 8, 1989

[54] ELECTRONIC SWITCHING APPARATUS HAVING IMPEDANCE MATCHING CIRCUITRY FOR ULTRA-HIGH FREQUENCY SIGNALS

[75] Inventor: Thierry Maitre, Rueil Malmaison, France

[73] Assignee: U.S. Philips Corporation, New York, N.Y.

[21] Appl. No.: 136,244

[22] Filed: Dec. 18, 1987

[30] Foreign Application Priority Data

Dec. 19, 1986 [FR] France ................................. 86 17863

[51] Int. Cl.4 ..................... H03K 17/56; H03K 17/52; H03F 3/68; H04N 5/268
[52] U.S. Cl. .................................. 307/241; 307/242; 307/243; 455/277; 328/104; 328/154; 330/124 R; 330/295; 358/181
[58] Field of Search ............... 307/240, 241, 242, 243, 307/244; 455/133, 134, 135, 136, 277, 278, 188, 191; 339/101, 103; 328/104, 154; 348/741, 742; 330/124 R, 126, 295; 358/181

[56] References Cited

U.S. PATENT DOCUMENTS

| 3,345,578 | 10/1967 | Shuda | 330/295 |
|---|---|---|---|
| 3,702,898 | 11/1972 | Webb | 328/154 |
| 3,757,139 | 9/1973 | Hunter | 307/242 |
| 4,223,235 | 9/1980 | Rufray | 307/241 |
| 4,397,041 | 8/1983 | Takeda et al. | 455/277 |
| 4,596,045 | 6/1986 | Maier | 455/133 |
| 4,719,374 | 1/1988 | Bialo | 307/242 |

FOREIGN PATENT DOCUMENTS 0233945 11/1985 Japan ................................. 455/277

Primary Examiner—Stanley D. Miller
Assistant Examiner—Huy Kim Mai
Attorney, Agent, or Firm—Michael E. Marion

[57] ABSTRACT

A switching device is realized by means of two amplifier paths which are controllable by means of transistors. The collectors of output transistors (T1, T1B) are connected together, without an impedance matching circuit for each path, to a common point (10) being connected to an impedance matching circuit (L5, R7) which is common for the two paths. This switching device is particularly used for selecting signal paths between 1 and 2 GHz in systems for receiving television signals by satellite.

6 Claims, 3 Drawing Sheets

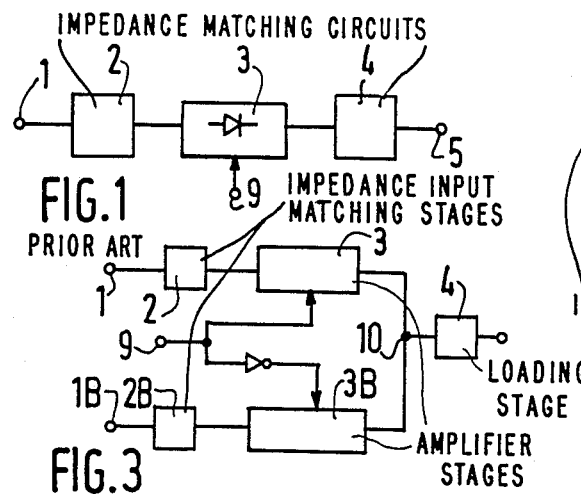
FIG.1 PRIOR ART
FIG.3
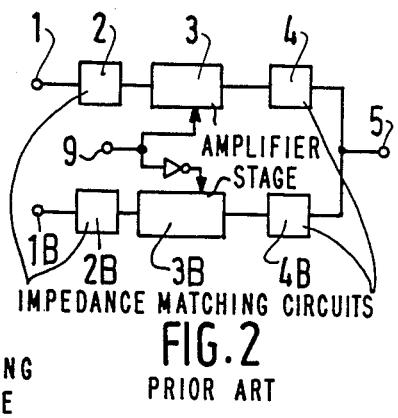
FIG.2 PRIOR ART
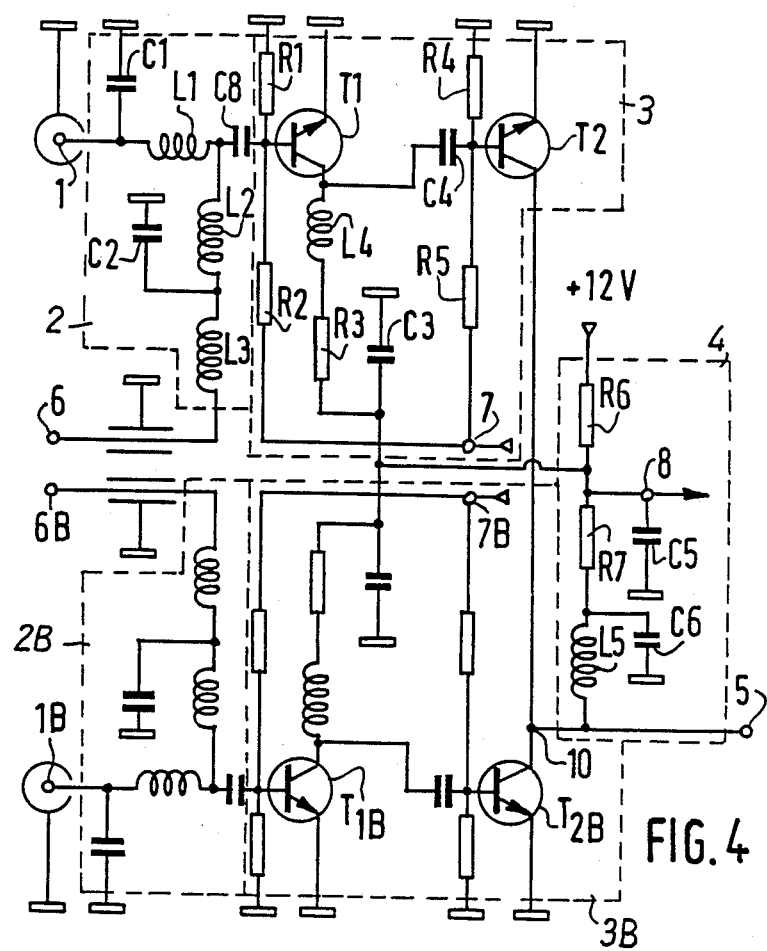
FIG.4

ELECTRONIC SWITCHING APPARATUS HAVING IMPEDANCE MATCHING CIRCUITRY FOR ULTRA-HIGH FREQUENCY SIGNALS

BACKGROUND OF THE INVENTION

The invention relates to an electronic switching apparatus for switching ultra high frequency television signals, for example, of the order of 1 to 2 GHz, comprising at least two paths each of which can, as required, either amplify or block a signal applied to its input, each path comprising an impedance matching input stage and an amplifier stage.

A switching device of this type is particularly used in arrangements for receiving television signals by satellite. In accordance with the standard defined for such receptions, two channels are transmitted simultaneously in accordance with two different directions of polarization and the receiver head end transmits the two signals each corresponding to one of the directions of polarization to a tuner. The switching device according to the invention can be used for selecting the reception of one of these two signals.

An electronic switching device for switching VHF television signals is known from the document U.S. Pat. No. 4,397,041. The arrangement described in this document functions at relatively low frequencies of the order of several MHz. It comprises two paths each loaded by half a winding of the transformer. If a switching device according to this document is to be used at ultra-high frequencies of signals to be received via satellite, which signals are located in the 1 to 2 GHz band, serious problems of impedance mismatching will occur because the load winding of the path which must be cut off represents a poorly controlled impedance in parallel with the other path.

SUMMARY OF THE INVENTION

It is an object of the invention to provide a single switching device for frequencies of 1 to 2 GHz in which the aforementioned problem is solved in a very simple manner.

To this end the switching apparatus according to the invention is characterized in that the outputs of the amplifier stages are directly connected to a common point which is connected to an impedance matching and loading stage which is common for all the paths. The term "directly connected" is understood to mean that they are DC coupled to a common point and that no impedance matching circuit is connected between this common point and the amplifier. This solution has the advantage of a great simplicity and, inter alia, it is not limited to a two-channel switching device but can be used in switching devices for switching as many paths as are desired.

In a particular embodiment of a switching device according to the invention in which each amplifier stage comprises a transistor arranged in common emitter configuration at the output is characterized in that in a first modification the collectors of these transistors are connected to said common point, said matching and loading stage being connected to a supply source for supplying a current to said collectors.

In a further embodiment the switching device is characterized in that the collectors of its transistors are each connected to a supply source via a resistor and are each connected via a diode to the said common point, said matching and loading stage being connected to a supply source for supplying the before mentioned current to the said collectors via the diodes which are forward-biassed for said current In all cases the signal amplifying transistors advantageously have their emitters connected directly to ground. It has been found that this arrangement surprisingly improves the isolating performance.

BRIEF DESCRIPTION OF THE DRAWINGS

The invention will now be described in greater detail by way of example with reference to the accompanying drawings in which FIG. 1 shows diagrammatically a known gain-controllable VHF amplifier FIG. 2 shows a known assembly of two amplifiers according to FIG. 1, constituting a switch FIG. 3 shows diagrammatically the assembly of two amplifiers for constituting a switching device according to the invention FIG. 4 shows a detailed circuit diagram of a first embodiment of the invention

DETAILED DESCRIPTION OF THE INVENTION

Figures 5, 6:
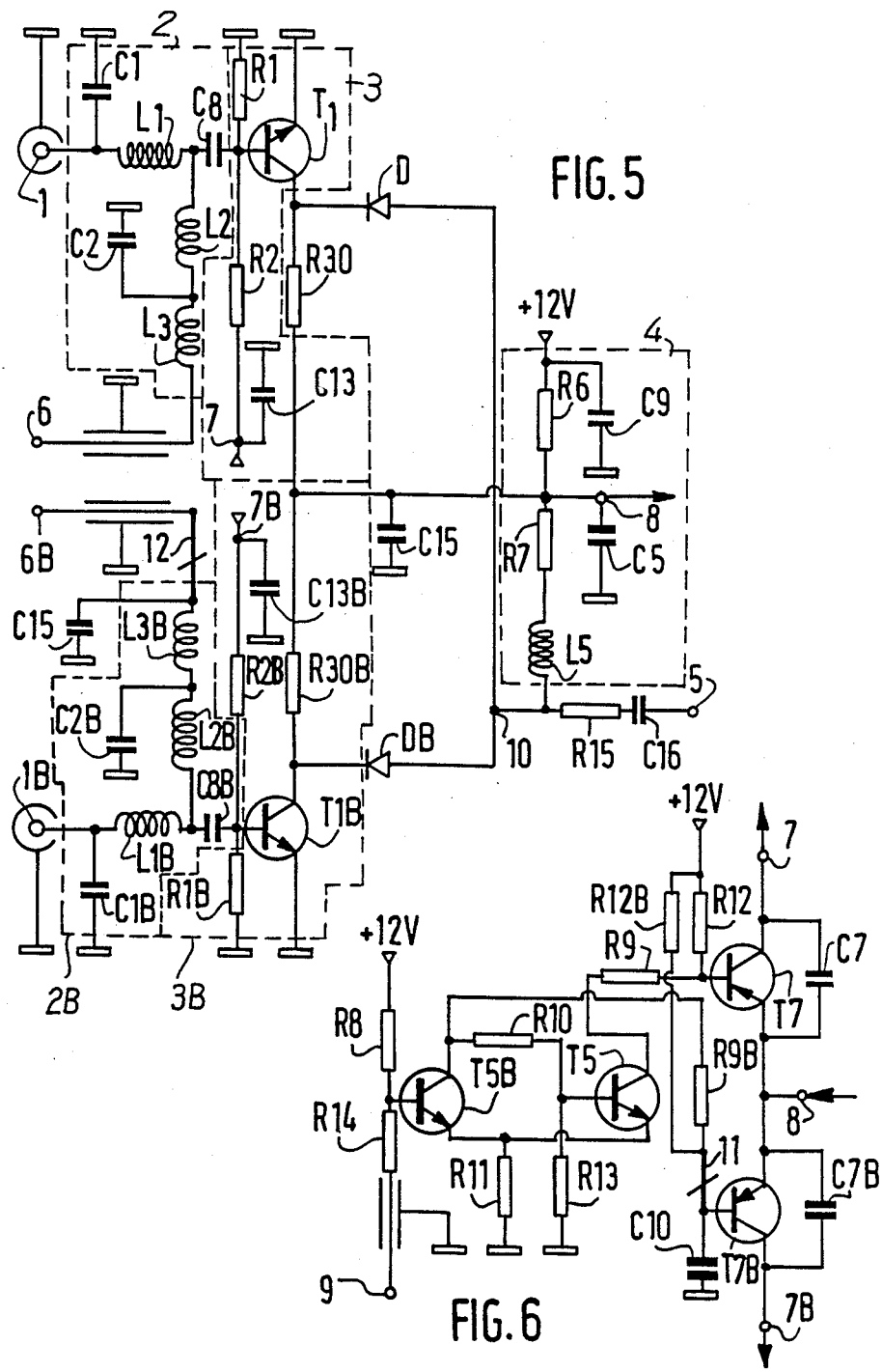
FIG. 5 shows the detailed circuit diagram of a second embodiment according to the invention
FIG. 6 shows the detailed circuit diagram of a gain control circuit for the circuits of FIGS. 4 and 5

In the circuit of FIG. 1 an input signal is applied to a terminal 1 which is connected to an impedance matching circuit 2, followed by an amplifier stage 3 whose gain can be controlled by means of a control voltage applied to the terminal 9 between a minimum value which corresponds to a state in which the signal is blocked or isolated and a maximum value which corresponds to a state in which the signal is amplified, and which is finally followed by an impedance matching circuit 4 supplying the amplified signal to an output terminal 5. The isolation is defined as the difference between the maximum gain and the minimum gain.

In FIG. 2 a switch is constituted by the combination of a first circuit 1 to 4 and a second circuit 1B to 4B each corresponding to the circuit diagram in FIG. 1.

The control voltage applied to the terminal 9 is directly applied to the first circuit and after inversion it is applied to the second circuit such that one is in a state in which the signal is isolated while the other is in the amplification state.

The two circuits are combined at the output. At very high frequencies such a known circuit has a serious drawback. Let it be assumed, for example that the path B is in the isolating state; the impedance matching circuit 4B in parallel with the output of the other circuit 4 has an impedance which varies with the frequency which may comprise zero values at certain frequencies and may constitute a trapping circuit causing the useful signal to be perturbed.

It is to be noted that if there are more than two paths more than one perturbation circuit can be constituted and the problem would even be more difficult to solve.

FIG. 3 shows a switching device according to the invention having two paths 2, 3 and 2B, 3B, respectively, each of which can, as required, amplify or isolate a signal applied to its inputs 1 and 1B, respectively, each path comprising an impedance matching input stage 2, 2B and an amplifier stage 3, 3B. The outputs of the amplifier stages 3, 3B are directly connected to a common point 10 which is connected to an impedance matching and loading stage 4 which is common for all the paths. Such a switching device is simpler than the known switching device. The impedance presented by the output of the isolating amplifier is a simple capacitor having a low value which is arranged parallel to that of the output of the forward path and does not produce any detrimental effect: it is sufficient to take it into account in determining the common matching circuit. It is inter alia possible to provide more than two paths without any difficulty.

In FIG. 4 each amplifier stage of a signal path comprises a transistor T2 or T2B at the output, arranged in common emitter configuration and the collectors of these transistors being connected to the common point 10. The matching and loading stage is constituted by an inductance L5 connected to one end to the common point 10 and at the other end to ground via a capacitor C6 and to a supply voltage source +12V via two series resistors R7 and R6 whose common connection point 8 is decoupled via a grounded capacitor C5. The path constituted by R6, R7, L5 permits of supplying a bias current to the collectors of the transistors T2, T2B. The connection between the outputs of the amplifiers represented in this case by collectors of the transistors T2, T2B is direct, and the connection from said collectors to the common point 10 is not provided with any impedance matching circuit. The impedance which is matched in this case by the matching and loading stage is determined as a function of the following stages and, as the case may be, this matching may be adjusted differently.

The signal of one path is presented to the input 1 and transmitted to the base of a first transistor T1, whose emitter is directly connected to ground, via an impedance matching circuit constituted by the capacitor C1 connected between the input 1 and ground, a series capacitor C8 and a series inductance L1, as well as by the elements L2, L3, C2 which will be explained hereinafter. The different components are arranged in a closed metallic housing and the symbol encircling the terminal 1 indicates the point of entrance to this housing. The signal is transmitted to the base of T1 via the capacitor C8. The collector of T1 is charged by an inductance L4 in series with a resistor R3 which is connected at the other end to a supply source which is available at the connection 8 and to a decoupling capacitor C3 connected to ground.

The collector of T1 is connected to the base of a second transistor T2 arranged in a cascade configuration therewith via a coupling capacitor C4. The second transistor T2 has its emitter also directly connected to ground and its collector constitutes the aforementioned output of the amplifier.

The bases of the two transistors T1 and T2 are polarized by one and the same circuit as will be described hereinafter with reference to FIG. 6. This circuit controls the amplification by influencing the polarization of the bases of the transistors T1, T2. Each of these bases is to this end connected to ground via a resistor R1 or R4, respectively and is connected via a resistor R2 or R5 to a gain control input terminal 7 which itself is connected to the circuit of FIG. 6.

The terminal 6 is a supply input which with the aid of the elements L3, C2, L2, which do not form part of the invention, permits of passing the supply current to a line connected to the terminal 1, and which has the desired impedance for the signal. This supply is intended for a receiver head usually situated with the reception aerial on the roofs of tall buildings.

The lower half of the Figure shows the elements of the second path with a signal input terminal 1B, and controllable amplifier transistors T1B, T2B. The elements of this path are identical to those of the first path described above and will thus not be further described again.

The collector of the output transistor T2B is directly connected to that of the transistor T2 of the first path by means of a connection to the common point 10 which is as short as possible and the matching and loading stage L5, C6, R7, C5 which is connected to this is common for the two paths.

FIG. 5 shows another preferred embodiment according to the invention. Each amplifier only comprises a transistor stage and the isolation is maintained at the same level as in the preceding assembly due to a diode D or DB (PIN diode) which is blocked when the path is in an isolating state.

The elements arranged between the input terminal 1 and the output of transistor T1 are the same as those of FIG. 4 and have the same reference numerals. It is the collector of T1 which constitutes the output of the amplifier in this case. A decoupling capacitor C13 is present at the gain control input terminal 7.

The diode D connects the collector of transistor T1 to the common point 10 of the matching and loading stage whose references L5, R7, C5 and their operation are the same as in the case of FIG. 4. The anode of the diode 10 is connected to the common point 10 and its cathode is connected to the collector of the transistor T1, thus D is arranged in the forward direction for the current of transistor T1. The collector of T1 is connected to the supply terminal 8 through of a resistor R30 which is not an impedance matching and loading element. Its function is to fix the potential of the collector to the potential of the point 8 when the transistor T1 is turned off and isolates the signal. The diode D is also blocked and the capacitance of its junction is incorporated in series in the signal path, which increases the isolation.

The elements of the second path are identical to those of the first and their references are the same with a symbol B. The references 12, C15 refer to the connection elements for the second path and are explained with reference to the wiring diagram of FIG. 7. The symbol B makes it possible to mark on the wiring plan of FIG. 7 which elements pertain to one path or to the other. The anode of the diode DB of the second path is directly connected to that of the diode D of the first path and to the common path 10 of the impedance matching and loading stage. The output signal is transmitted to other circuits not shown via a capacitor C16 and a resistor R15 in series which also contribute to the impedance matching.

FIG. 6 also shows the two connections 7 and 7B of FIGS. 4 and 5. Each is connected to the collector of a transistor T7, T7B whose emitter is connected to the supply terminal 8, the emitter collector electrodes being interconnected through a capacitor C7, C7B to avoid any risk of oscillation and each base being connected to a supply source +12V via a resistor R12, R12B and to the collector of another transistor T5, T5B via a resistor R9, R9B respectively. The two transistors T5, T5B are arranged in known manner, referred to as a Schmitt trigger, with their emitters being interconnected and being jointly connected to ground via a resistor R11, whilst the base of T5 is connected to the collector of T5B via a resistor R10 and to ground via a resistor R13. The base of T5B is connected to the common connection point of the two series-arranged resistors R8, R14 connected between the supply source +12V and control terminal 9 of the switch.

If the voltage at this terminal 9 is low, the transistors T5 and T7 are conducting and consequently T1 is conducting likewise as D, while the transistors T5B, T7B and the active elements of the second path referenced B are blocking and the second path is isolated. If the voltage at the terminal 9 is high, the process is reversed.

The reference numeral 11 near the base of T7B indicates a connection realized by a wire in the wiring of the circuit. This relatively long wire is decoupled on the side of the base of T7B by means of a capacitor C10.

Figure 7:
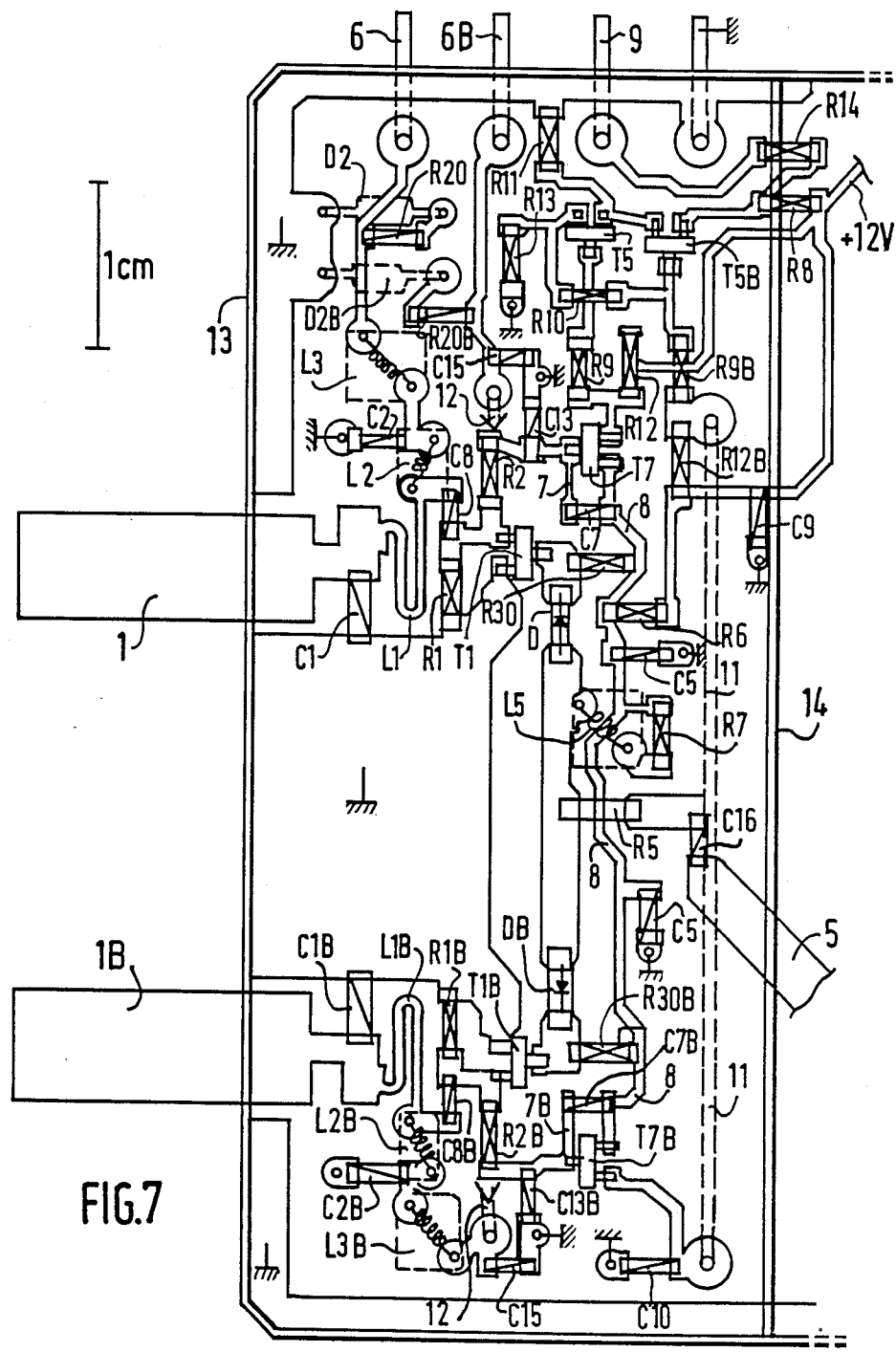
FIG. 7 shows on scale a diagram for a practical realization of a circuit comprising the combined elements of FIGS. 5 and 6.

FIG. 7 shows the assembly of the circuits of FIGS. 5 and 6 on a scale which is indicated in the drawing by means of a reference "1cm". This circuit is realized on a double-faced printed circuit board having metallized holes and arranged in a housing whose exterior wall perpendicular to the circuit is indicated by the reference numeral 13, and an interior partition separating the switching device from the other circuit, which are not described, is denoted by the reference numeral 14. The components of this embodiment have the same reference numerals as in FIGS. 5 and 6. It is thus not necessary to describe the interconnections again. Substantially all components are surface mounted components, or "CMS", and are arranged flat on the copper connections of the printed circuit. The inductances L1, L1B are printed on the circuit. Only the inductances L2, L2B, L3, L3B, L5 are discrete elements provided with connections extending through the printed circuit. These elements are thus situated on the surface opposite to the one shown. This other surface is substantially entirely metallized to constitute a ground plane except for some locations reserved for through-connections which are not connected to ground, notably those of the inductances as discrete elements. The different points indicated in the drawing as being connected to ground are connected via a metallized hole to the second surface, i.e. to the ground plane. The elements of the ground plane situated on the side of the components CMS are provided on their circumference with a two of metallized holes (not shown) to ensure en efficient connection to ground.

The input terminals 1, 1B are metallic laminations whose length is determined by impedance matching considerations (Zc=75Q). The inputs 6, 6B, 9 and ground terminal are grouped (at the top of the drawing) and the connections 6, 6b near the input in the housing are connected to ground via safety diodes D2, D2B arranged in series with resistors R20, R20B of 22Q.

The elements denoted by the reference numeral 12 in FIG. 5, and the reference numeral 11 in FIG. 6 are wires situated on the surface opposite to that carrying the majority of components. The wire 11 is shown in a broken line in FIG. 7. For the sake of clarity of the Figure the wire 12 is only shown with its start and end denoted by arrows. This wire 12 connects the metallization of the input 6B at the top of the Figure and the common point at L2B and C15 at the bottom of the Figure. Because of the parasitic inductance of these relatively long wires, which may be "cold" connections, their extremities are decoupled to ground by means of capacitors C15 and C10 for the wires 12 and 11, respectively. The capacitor C15 is divided into two components each connected to a wire extremity.

The components used in the circuits of FIGS. 5, 6, 7 have, for example the following values:

| | |
|---|---|
| C1 = 0,5 pF | R1 = 1 kQ |
| C2 = 10 pF | R2 = 2.2 kQ |
| C5 = 2 × 100 pF | R30 = 10 kQ |
| C7, C7B = 47 nf | R6 = 100Q |
| C8 = 5 pF | R7 = 47Q |
| C9 = 100 pF | R8 = 100 kQ |
| C10 = 100 pF | R9, R9B = 6.8 kQ |
| C15 = 2 × 100 pF | R10 = 82 kQ |
| | R11 = 1.2 kQ |
| T1 = BFR 92A | R12, R12B = 2.2 kQ |
| T1B = BFR 92AR | R13 = 47 kQ |
| D, DB = BA 679 | R14 = 5.6 kQ |
| T5 = BC848BR | |
| T5B = BC848B | L2 1.5 copper turn 50/100° internal diameter 2 mm |
| T7 = BC858BR | L3 5.5 copper turn 50/100° internal diameter 2.5 mm |
| T7B = BC858B | L5 1.5 copper turn 50/100° internal diameter 3 mm. |

The assembly of FIGS. 5 and 7 has the following performances:
band of useful frequencies: 900 to 1800 MHz
impedance of an input: 75Q
insulation of the insulating path $\geq 35$ dB
gain of an active path $\geq 8$ dB
typical stationary wave ratio: 1.5
compatibility TTL for the control (terminal 9)

Up to now such performances could not be achieved without coaxial relays or assemblies using expensive professional PIN diodes.

Various modifications of this assembly are possible without passing beyond the scope of the invention. For example the transistors T1, T2 may be replaced by MOS transistors by adapting the polarisations which those skilled in the art can readily carry out. In that case the terms gate, source, drain instead of base, emitter and collector should be used.

I claim:

1. An electronic switching apparatus for switching a plurality of ultra-high frequency signals and providing one of said signals at a circuit output, comprising:
    (a) a control means for providing a control signal;
    (b) a plurality of signal paths having a common signal output, each of said signal paths comprising a signal input for receiving one of said ultra-high frequency signals, an impedance matching input stage having an input coupled to said signal input and a stage output, amplifier means coupled to said control means and having an input coupled to said stage output and an amplified signal output directly coupled to said common signal output, and
    (c) an impedance matching and loading stage having an input coupled to said common signal output and an output coupled to said circuit output;
    wherein each of said amplifier means alternatively blocks or amplifies and connects its respective ultra-high frequency signal to said common signal output in response to said control signal.

2. The electronic switching apparatus of claim 1 further comprising a supply source, wherein:
    (a) each said amplifier means comprises a transistor having an emitter and a collector, and said collector is coupled to said common signal output, and said transistor is arranged in common emitter configuration; and (b) wherein said impedance matching and loading stage is coupled to said supply source for supplying a current to each of said signals paths.

3. An electronic switching apparatus as claimed in claim 2, characterized in that said emitter of said transistor is connected directly to ground.

4. The electronic switching apparatus of claim 2, wherein said amplifier means of each of said signal paths comprises:

(a) first and second transistors mutually coupled to each other by a capacitive connection, each of said first and second transistors comprising an emitter coupled directly to ground, and a base; and (b) means coupled to the bases of said first and second transistors, for controlling the amplification of said amplifier means by varying the polarization of said bases.

5. The electronic switching apparatus of claim 1 further comprising a supply source, wherein:

each said amplifier means comprises a transistor having an emitter and a collector, and said transistor is arranged in common emitter configuration and said collector is coupled to said supply source by a resistor and to said common signal output by a diode.

6. An electronic switching apparatus as claimed in claim 5, characterized in that said emitter of said transistor is connected directly to ground.

* * * * *